(12) United States Patent
Park et al.

(10) Patent No.: US 8,633,490 B2
(45) Date of Patent: Jan. 21, 2014

(54) ORGANIC ELECTROLUMINESCENCE DISPLAY AND MANUFACTURING METHOD THEREOF

(75) Inventors: Sang-Il Park, Yongin (KR); Tae-Kyung Ahn, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/443,485

(22) Filed: Apr. 10, 2012

(65) Prior Publication Data

US 2012/0292645 A1 Nov. 22, 2012

(30) Foreign Application Priority Data

May 20, 2011 (KR) .......................... 10-2011-0047945

(51) Int. Cl.
*H01L 51/52* (2006.01)
*H01L 51/56* (2006.01)

(52) U.S. Cl.
USPC .......... 257/59; 257/88; 257/E51.018; 349/42; 349/43

(58) Field of Classification Search
USPC ................... 257/59, 88; 349/42, 43
See application file for complete search history.

(56) References Cited

U.S. PATENT DOCUMENTS

| 5,453,856 A | 9/1995 | Kim | |
|---|---|---|---|
| 2006/0147650 A1* | 7/2006 | Park | 428/1.1 |
| 2009/0230402 A1* | 9/2009 | Lee et al. | 257/72 |
| 2010/0270538 A1* | 10/2010 | Kang | 257/40 |
| 2011/0042666 A1* | 2/2011 | Yang et al. | 257/43 |

FOREIGN PATENT DOCUMENTS

| JP | 6-258670 | 9/1994 |
|---|---|---|
| KR | 10-2003-0021744 | 3/2003 |
| KR | 10-2004-0060038 | 7/2004 |
| KR | 10-2004-0062195 | 7/2004 |

\* cited by examiner

*Primary Examiner* — Matthew W Such
*Assistant Examiner* — Stephen Bradley
(74) *Attorney, Agent, or Firm* — H.C. Park & Associates, PLC

(57) ABSTRACT

An organic electroluminescence display including: a gate line disposed on a substrate; a data line crossing the gate line; a TFT connected to the gate and data lines; a capacitor connected to the TFT; and an OLED connected to the TFT. A gate electrode of the TFT and a lower electrode of the capacitor are patterned from a first layer. A gate insulating layer disposed on the gate electrode and an insulating island disposed on the gate line are patterned from a second layer. A semiconductor island disposed on the insulating island and an active layer disposed on the gate insulating layer are patterned from a third layer. An insulating layer is disposed on the TFTs, the capacitor, and between the semiconductor island and the data line. An upper electrode of the capacitor, source/drain electrodes of the TFT, and the data line are patterned from a fourth layer.

18 Claims, 11 Drawing Sheets

ORGANIC ELECTROLUMINESCENCE DISPLAY AND MANUFACTURING METHOD THEREOF

CROSS-REFERENCE TO RELATED PATENT APPLICATION

This application claims priority from and the benefit of Korean Patent Application No. 10-2011-0047945, filed on May 20, 2011, which is hereby incorporated by reference for all purposes as if fully set forth herein.

BACKGROUND OF THE INVENTION

1. Field of the Invention

Exemplary embodiments of the present invention relate to an organic electroluminescence display and a method of manufacturing the organic electroluminescence display.

2. Discussion of the Background

In an active matrix organic electroluminescence display, pixels are formed between a matrix of gate lines and data lines. Each of the pixels includes thin-film transistors (TFTs), capacitors, and an organic light-emitting device connected to the TFTs and the capacitors. The organic light-emitting device generates light in response to an appropriate driving signal received from the TFTs and the capacitors, and thus, a desired image is displayed.

However, because the gate lines and data lines are arranged in a matrix, portions of the gate lines and the data lines overlap. A parasitic capacitance occurs at the overlapping portions. The parasitic capacitance makes the realization of a high resolution image difficult. Therefore, there is a need to reduce the parasitic capacitance.

SUMMARY OF THE INVENTION

Exemplary embodiments of the present invention provide an organic electroluminescence display that can reduce a parasitic capacitance between gate lines and data lines, and a method of manufacturing the organic electroluminescence display.

Additional features of the invention will be set forth in the description which follows, and in part will be apparent from the description, or may be learned by practice of the invention.

According to an aspect of the present invention, there is provided an organic electroluminescence display including: a gate line disposed on a substrate; a data line extending across the gate line in a crossing region; a first thin-film transistor (first TFT) that is electrically connected to the gate line and the data line, sequentially comprises a gate electrode, an active layer that comprises an oxide semiconductor, source and drain electrodes, and a gate insulating layer interposed between the gate electrode and the active layer; a capacitor that is electrically connected to the first TFT and includes a lower electrode and an upper electrode; an insulating layer interposed between the lower electrode and the upper electrode; a second TFT electrically connected to the capacitor; and an organic light-emitting diode (OLED) electrically connected to the second TFT. A semiconductor island separated from the active layer is disposed in the crossing region on the gate line. The semiconductor island comprises an oxide semiconductor and is formed of the same material as the active layer. An insulating island separated from the gate insulating layer is formed between the semiconductor island and the gate line, in the crossing region. The insulating island is formed of the same material as the gate insulating layer.

According to an aspect of the present invention, there is provided a method of manufacturing an organic electroluminescence display, the method comprising: patterning a first layer to form a gate electrode of a thin-film transistor (TFT), a lower electrode of a capacitor, and the gate line on a substrate; patterning a second layer to form a gate insulating layer on the gate electrode and an insulating island in the crossing region; patterning a third layer that comprises an oxide semiconductor to form an active layer on the gate insulating layer and a semiconductor island that is on the insulating island; forming a first insulating layer on the active layer, the lower electrode, and the semiconductor island; and patterning a fourth layer to form a source electrode and a drain electrode of the first TFT, an upper electrode of the capacitor, and a data line, on the first insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
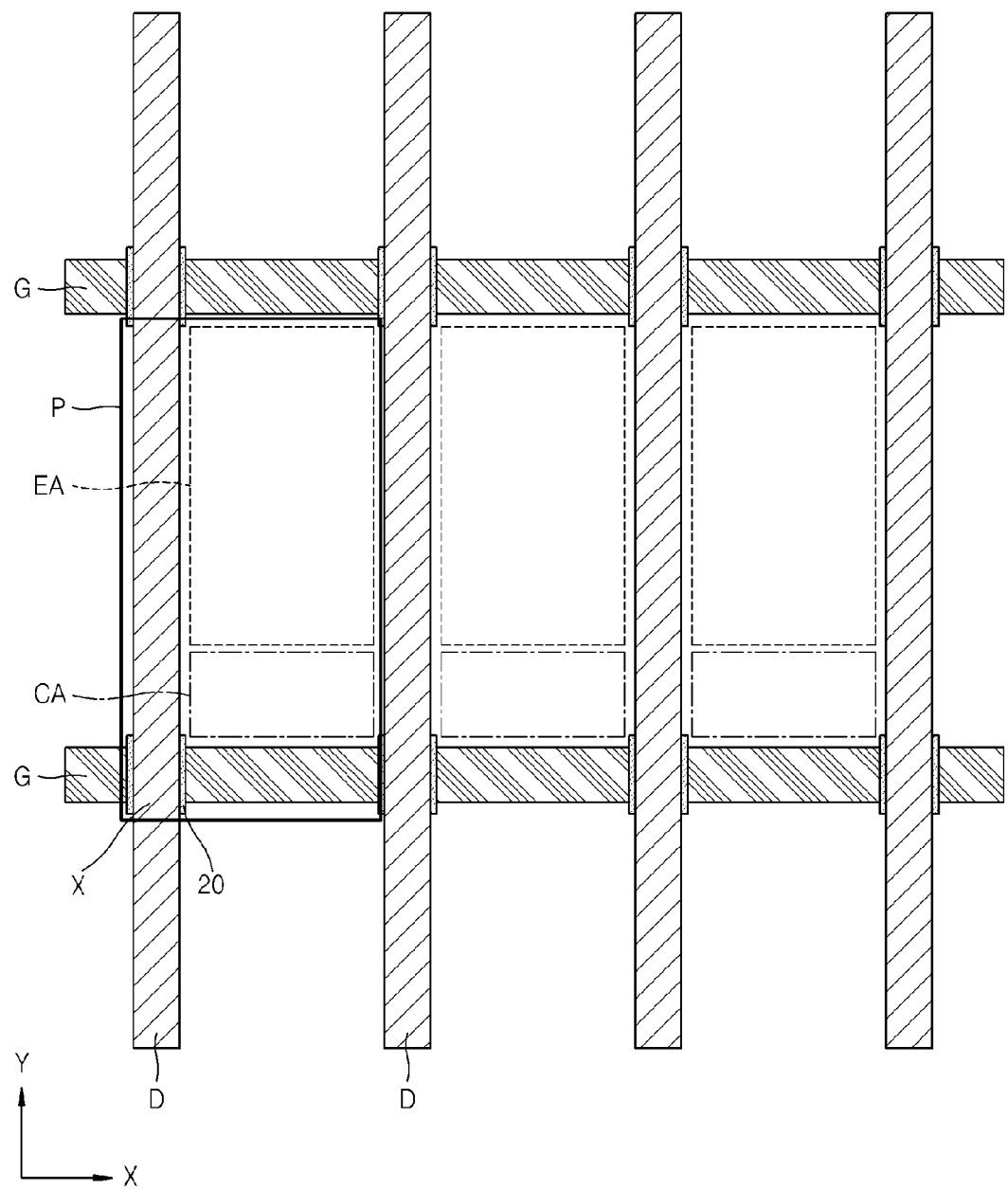
FIG. 1 is a schematic plan view of an organic electroluminescence display, according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that, although the terms 'first', 'second', etc. may be used herein to describe various elements, these elements should not be limited by these terms. These terms are only used to distinguish one element from another.

The terminology used herein is for the purpose of describing embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a schematic plan view of an organic electroluminescence display, according to an exemplary embodiment of the present invention. Referring to FIG. 1, the organic electroluminescence display includes gate lines G extending in an X-axis direction and data lines D extending in a Y-axis direction, which is substantially perpendicular to the X-axis direction. In FIG. 1, power lines (V in FIG. 2) are omitted.

Pixel regions P are defined by the gate lines G and the data lines D. The pixel regions P are rectangular regions formed where the data lines D and the gate lines G cross.

Each pixel region P includes a light-emitting region EA and a circuit region CA. The light-emitting region EA includes an organic light-emitting diode (OLED) and generates light. The circuit regions CA are electrically connected to the data lines D and the gate lines G, and each circuit region CA includes at least one thin-film transistor (TFT) and at least one capacitor. The circuit region CA is a region for driving the OLED.

Crossing regions X are regions where the data lines D and the gate lines G overlap. Each of the pixel regions P includes at least one crossing region X. The crossing region X includes a semiconductor island 20 and an insulating island 13 (refer to FIG. 4), which are separate from the circuit region CA.

Figure 2:
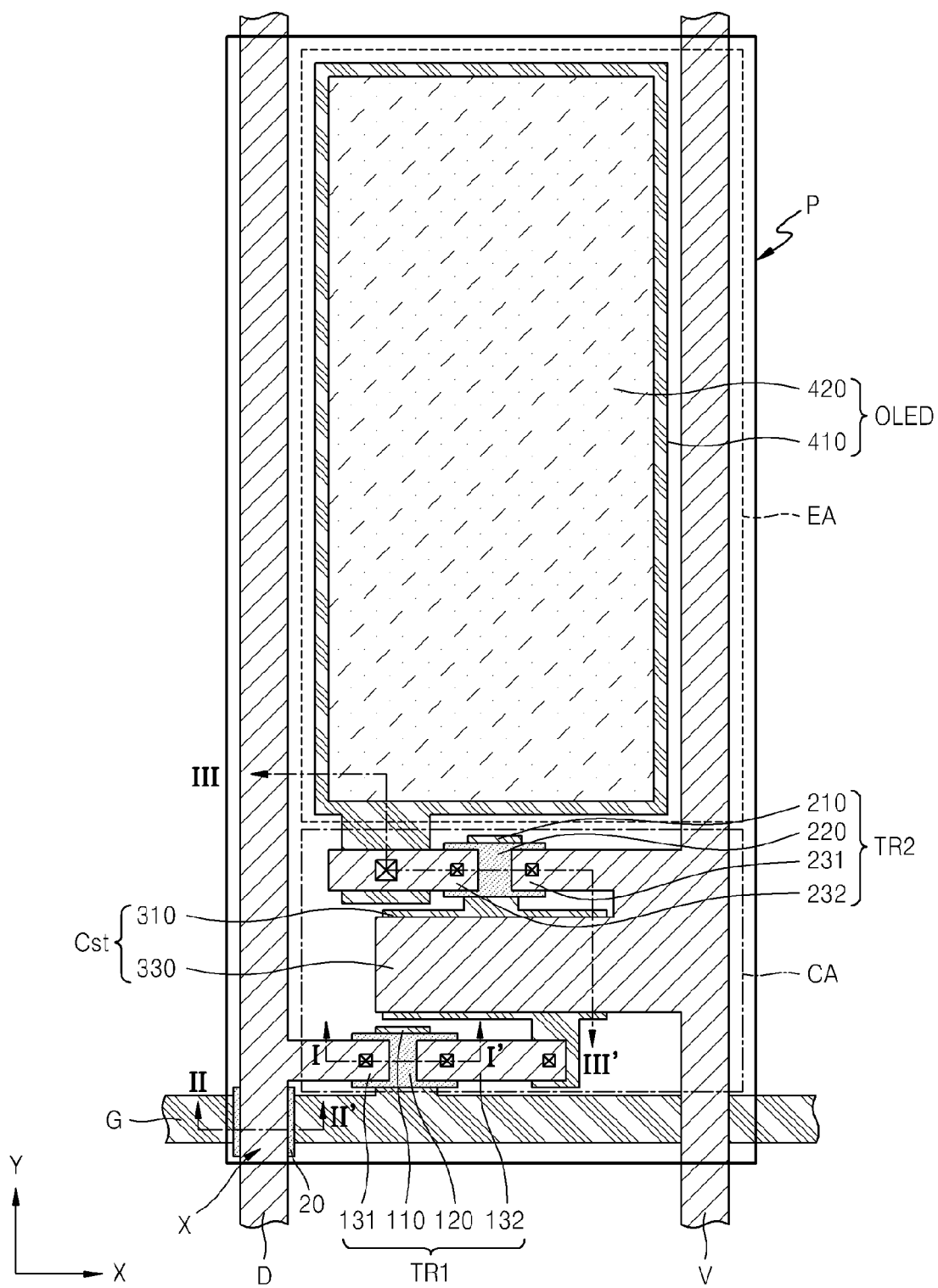
FIG. 2 is a magnified plan view of a portion of the organic electroluminescence display of FIG. 1.
Figure 3:
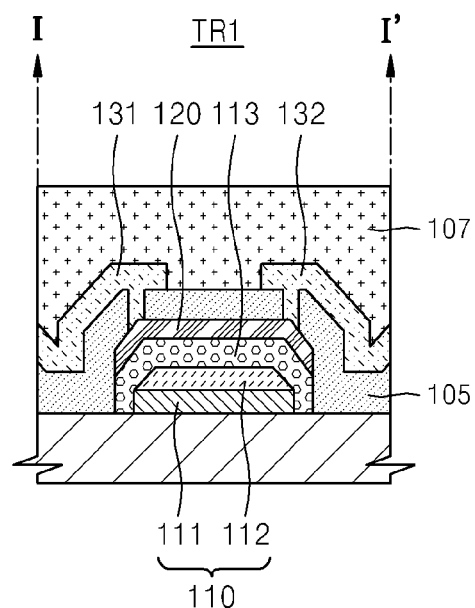
FIG. 3 is a cross-sectional view taken along line I-I' of FIG. 2.
Figure 4:
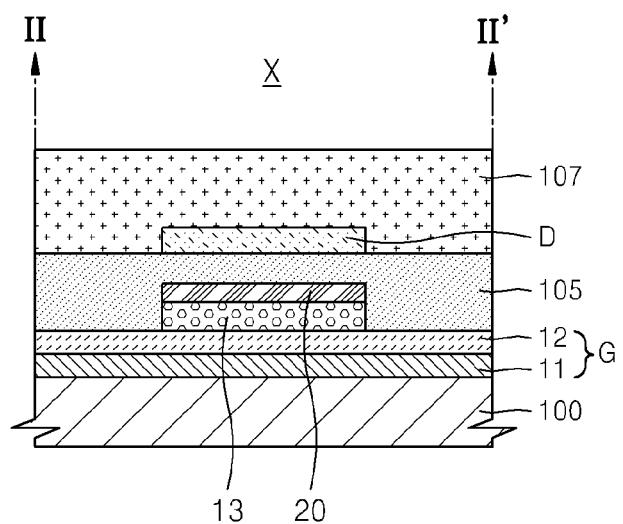
FIG. 4 is a cross-sectional view taken along line II-II' of FIG. 2.

FIG. 2 is a magnified plan view of the pixel region P of the organic electroluminescence display of FIG. 1. FIG. 3 is a cross-sectional view taken along line I-I' of FIG. 2, FIG. 4 is a cross-sectional view taken along line II-II' of FIG. 2, and FIG. 5 is a cross-sectional view taken along line III-III' of FIG. 2.

Referring to FIGS. 2 through 5, a first TFT TR1, a second TFT TR2, and a capacitor Cst are included in the circuit region CA. However, the number of transistors and capacitors is not limited thereto.

Figure 5:
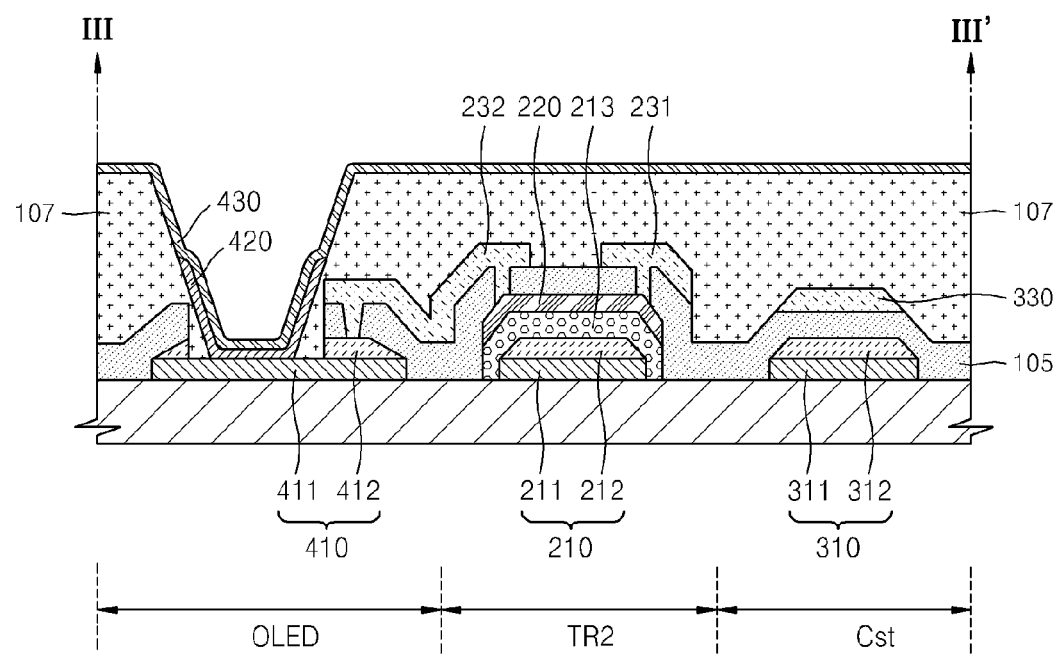
FIG. 5 is a cross-sectional view taken along line III-III' of FIG. 2.

In FIGS. 2, 3, and 5, a bottom gate-type TFT is depicted. However, the present invention is not limited thereto.

Referring to FIG. 3, the first TFT TR1 functions as a switching transistor and is connected to the gate line G and the data line D. The first TFT TR1 is turned on in response to a gate signal applied to a source and outputs a data signal through a drain.

The first TFT TR1 includes a first gate electrode 110, a first active layer 120 that includes an oxide semiconductor, a first source electrode 131, and a first drain electrode 132 sequentially formed on a substrate in the stated order. The first gate electrode 110 protruds from the gate line G. The first gate electrode 110 includes a first conductive layer 111 and a second conductive layer 112. The first conductive layer 111 includes a transparent conductive material, for example, ITO, IZO, and/or ZnO. The second conductive layer 112 includes a low resistance material, for example, Mo, Al, Pt, Pd, Au, and/or Cu.

Since the first gate electrode 110 is formed as a multiple layer structure, a pixel electrode 410 (refer to FIG. 5) and the first gate electrode 110 can be simultaneously formed of the same layer. In this way, the number of masks used for manufacturing an organic electroluminescence display can be reduced. Thus, manufacturing costs and processing steps can be reduced.

A first gate insulating layer 113 is formed on the first gate electrode 110. The first gate insulating layer 113 insulates the first gate electrode 110 from the first active layer 120. The first gate insulating layer 113 may include an inorganic material, such as $SiO_2$ or SiNx, or an organic material.

The first gate insulating layer 113 is not formed on the entire surface of the substrate 100. Instead, the first gate insulating layer 113 is formed between the first gate electrode 110 and the first active layer 120 of the first TFT TR1. Also, a second gate insulating layer 213 corresponding to the first gate insulating layer 113 is formed between a second gate electrode 210 and a second active layer 220 of the second TFT TR2. The insulating island 13 corresponding to the first gate insulating layer 113 is formed between the gate line G and the semiconductor island 20 of the crossing region X.

An insulating layer corresponding to the first gate insulating layer 113 is not formed between an upper electrode 330 and a lower electrode 310 of the capacitor Cst. Accordingly, a distance between the upper and lower electrodes 330 and 310 of the capacitor Cst is reduced, thereby increasing a charge capacitance of the capacitor Cst. A distance between the data lines D and the gate lines G is increased by the insulating island 13 in the crossing region X, thereby reducing a parasitic capacitance at the crossing region X.

The first active layer 120 is formed on the first gate insulating layer 113. According to an aspect of the present invention, the first active layer 120 includes an oxide semiconductor. For example, the first active layer 120 may have the formula $a(In_2O_3)b(Ga_2O_3)c(ZnO)$ (G-I—Z—O) (where a, b, and c are real numbers that respectively satisfy $a \geq 0$, $b \geq 0$, and $c > 0$) or may be a Hf—In—Zn—O layer.

A first insulating layer 105 is formed on the first active layer 120, to insulate the first active layer 120 from the first source electrode 131 and the first drain electrode 132. The first insulating layer 105 may function as an etch stop layer (ESL) to protect the first active layer 120, and may include an inorganic material, such as $SiO_2$ or SiNx, or an organic material. Unlike the first gate insulating layer 113, the first insulating layer 105 is formed on the entire surface of the substrate 100.

The first source electrode 131 and the first drain electrode 132 are formed on regions of the first insulating layer 105 corresponding to the first active layer 120. The first source electrode 131 extends from the data line D. A pixel-defining layer 107 is formed thereon.

Referring to FIG. 4, the crossing region X includes the gate line G, the insulating island 13, the semiconductor island 20, and the data line D. The gate line G is formed from the same layer of material as the first gate electrode 110. The first gate electrode 110 extends from the gate line G. Accordingly, in FIG. 4, a transparent conductive layer 11 corresponds to the first conductive layer 111 of the first gate electrode 110, and a low resistance conductive layer 12 corresponds to the second conductive layer 112 of the first gate electrode 110.

The insulating island 13 is formed on the gate line G in the crossing region X. The insulating island 13 and the first gate insulating layer 113 are formed simultaneously from the same material. The insulating island 13 is independently formed and is formed only in the crossing region X. The insulating island 13 is in the form of an island that is separated from the first gate insulating layer 113. The insulating island 13 may have a width in the X-axis direction that is equal to or greater than that of the data line D. The insulating island 13 may have a length in the Y-axis direction that is equal to or greater than that of the gate line G. If the insulating island 13 has smaller dimensions than the data line D and the gate line G, a parasitic capacitance in the crossing region X may be increased.

The semiconductor island 20 is formed on the insulating island 13. The semiconductor island 20 and the first active layer 120 are formed simultaneously, using the same material used to form the first active layer 120. Thus, the semiconductor island 20 may include an oxide semiconductor. The semiconductor island 20 is formed as an island in the crossing region X and is separate from the first active layer 120. The semiconductor island 20 may have an area equal to that of the insulating island 13. For example, a width of the semiconductor island 20 in the X-axis direction may be equal to that of the insulating island 13, and a length of the semiconductor island in the Y-axis direction may be equal to that of the insulating island 13.

The first insulating layer 105 is formed on the semiconductor island 20. As described above, because the first insulating layer 105 is formed on the entire surface of the substrate 100, the first insulating layer 105 is also formed in the crossing region X.

The data line D is formed on the first insulating layer 105. The data line D extends substantially perpendicular to the gate line G. The data line D, the first source electrode 131, and the first drain electrode 132 are formed from the same layer of material.

Since the insulating island 13 and the semiconductor island 20 are formed in the crossing region X, the parasitic capacitance in the crossing region X may be reduced. A capacitance between the two electrodes is determined according to Equation 1 below. In Equation 1, C is charge capacity, c is dielectric constant, A is area of electrode, and d is distance between electrodes.

$$C = \varepsilon \frac{A}{d} \qquad \text{[Equation 1]}$$

That is, because the data line D and the gate line G overlap in the crossing region X, a charge capacity formed by the data line D and the gate line G is determined by the dielectric constant ∈ of each of the first insulating layer 105, the semiconductor island 20, and the insulating island 13, between the data line D and the gate line G, the distance d between the data line D and the gate line G, and the area A of the region where the data line D and the gate line G overlap.

Because the insulating island 13 and the semiconductor island 20 are formed between the data line D and the gate line G, the distance d between the data line D and the gate line G may be increased. Thus, the parasitic capacitance in the crossing region X is reduced.

Referring to FIG. 5, the capacitor Cst is electrically connected to the first TFT TR1 and stores applied data signals. The capacitor Cst includes the lower electrode 310, the upper electrode 330, and the first insulating layer 105 interposed between the lower electrode 310 and the upper electrode 330.

The lower electrode 310 is formed on the substrate 100, from the same layer of material as the first gate electrode 110. Accordingly, the lower electrode 310 includes a first layer 311 and a second layer 312. The first layer 311 includes the same transparent conductive material as the first conductive layer 111. The second layer 312 includes the same low resistance conductive material as the second conductive layer 112.

The upper electrode 330 is formed from the same layer of material the first source electrode 131 and the first drain electrode 132. The upper electrode 330 extends from the power line V. The power line V may be formed from the same layer of material as the data line D. The first insulating layer 105 is interposed between the lower electrode 310 and the upper electrode 330.

Since the first insulating layer 105 is interposed between the lower electrode 310 and the upper electrode 330 and is formed of a single layer, the charge capacity of the capacitor Cst may be increased. Referring to Equation 1, because a charge capacity of the capacitor Cst is inversely proportional to a distance d between the two electrodes, the charge capacity may be increased as the distance between the two electrodes decreases. A large capacitance can be produced, because only the first insulating layer 105 is interposed between the lower electrode 310 and the upper electrode 330.

According to the current embodiment, the parasitic capacitance in the crossing region X can be reduced and the charge capacity of the capacitor Cst can be increased. If the first insulating layer 105 is thickly formed or the first gate insulating layer 113 is formed on the entire surface of the substrate to reduce the parasitic capacitance in the crossing region X, the charge capacity of the capacitor Cst may be reduced. However, because the insulating island 13 and the semiconductor island 20 are independently formed, this effect may be prevented.

Referring to FIG. 5, the second TFT TR2 functions as a driving transistor, by being electrically connected to the capacitor Cst. The OLED is connected to a drain of the second TFT TR2, and the second TFT TR2 outputs a driving current for driving the OLED, when turned on.

The second TFT TR2 includes the second gate electrode 210, the second active layer 220 that includes an oxide semiconductor, a second source electrode 231 and a second drain electrode 232. Also, a second gate insulating layer 213 is interposed between the second gate electrode 210 and the second active layer 220. The configuration of the second TFT TR2 corresponds to the configuration of the first TFT TR1, and thus, the description thereof will not be repeated.

In particular, the second gate electrode 210, the second active layer 220, the second source electrode 231, and the second drain electrode 232 respectively correspond to the first gate electrode 110, the first active layer 120, the first source electrode 131, and the first drain electrode 132. The second gate insulating layer 213 corresponds to the first gate insulating layer 113. A transparent conductive layer 211 and a low resistance conductive layer 212 respectively correspond to the first conductive layer 111 and the second conductive layer 112.

The second drain electrode 232 of the second TFT TR2 is electrically connected to the OLED. The OLED includes a pixel electrode 410, a facing (opposing) electrode 430, and an organic light-emitting layer 420 interposed between the pixel electrode 410 and the facing electrode 430.

The pixel electrode 410 is formed from the same layer or material as the first gate electrode 110. The pixel electrode 410, similar to the first gate electrode 110, includes a first electrode layer 411 and a second electrode layer 412. The first electrode layer 411 is formed of a transparent conductive material and directly contacts the organic light-emitting layer 420. The first electrode layer 411 includes a transparent conductive material such as ITO, IZO, or ZnO and is exposed by removing a portion of the second electrode layer 412, to make the connection. The second electrode layer 412 includes a low resistance conductive material and directly contacts the second drain electrode 232.

The pixel electrode 410, the first and second gate electrodes 110 and 210, and the lower electrode 310 of the capacitor Cst can be simultaneously formed. Thus, a manufacturing process thereof can be simplified.

The facing electrode 430 may include a metal having a low work function, such Ag, Mg, Al, Pt, Pd, Au, Ni, Nd, Ir, Cr, and/or Li. The pixel electrode 410 may function as an anode electrode, and the facing electrode 430 may function as a cathode electrode. However, the present invention is not limited thereto, and the polarities of the pixel electrode 410 and the facing electrode 430 may be reversed.

The organic light-emitting layer 420 may be formed by stacking a hole injection/transport layer, a light-emitting layer, and an electron injection/transport layer, or by selectively stacking some of the layers described above. However, at least the the light-emitting layer should be included. Although not shown, a protective layer may further be formed on the facing electrode 430, and a sealing operation may be performed using glass.

The pixel-defining layer 107 may be formed to entirely cover the first and second TFTs TR1 and TR2, the capacitor Cst, and the pixel electrode 410. An opening that exposes the pixel electrode 410 is formed in the pixel-defining layer 107. The organic light-emitting layer 420 and the facing electrode 430 are formed on the exposed portion of the first electrode layer 411.

FIGS. 6 through 12 are cross-sectional views showing a method of manufacturing the organic electroluminescence display of FIG. 2, according to an exemplary embodiment of the present invention. In FIGS. 6 through 12, for convenience of explanation, a method of manufacturing the second TFT TR2, the capacitor Cst, the OLED, and the crossing region X of the constituent elements in the pixel region P included in FIGS. 4 and 5 is shown. The first TFT TR1 is manufactured in the same method as the second TFT TR2, and thus, the description thereof will not be repeated.

The organic electroluminescence display may be manufactured using five masks. FIGS. 6, 7, 9, 10, and 11 are cross-sectional views of the organic electroluminescence display respectively manufactured by using first, second, third, fourth, and fifth masks.

As described above, because the second gate electrode 210, the lower electrode 310, and the pixel electrode 410 are formed as double layers, the organic electroluminescence display can be manufactured using only five masks. Therefore, process efficiency is increased.

Figure 6:
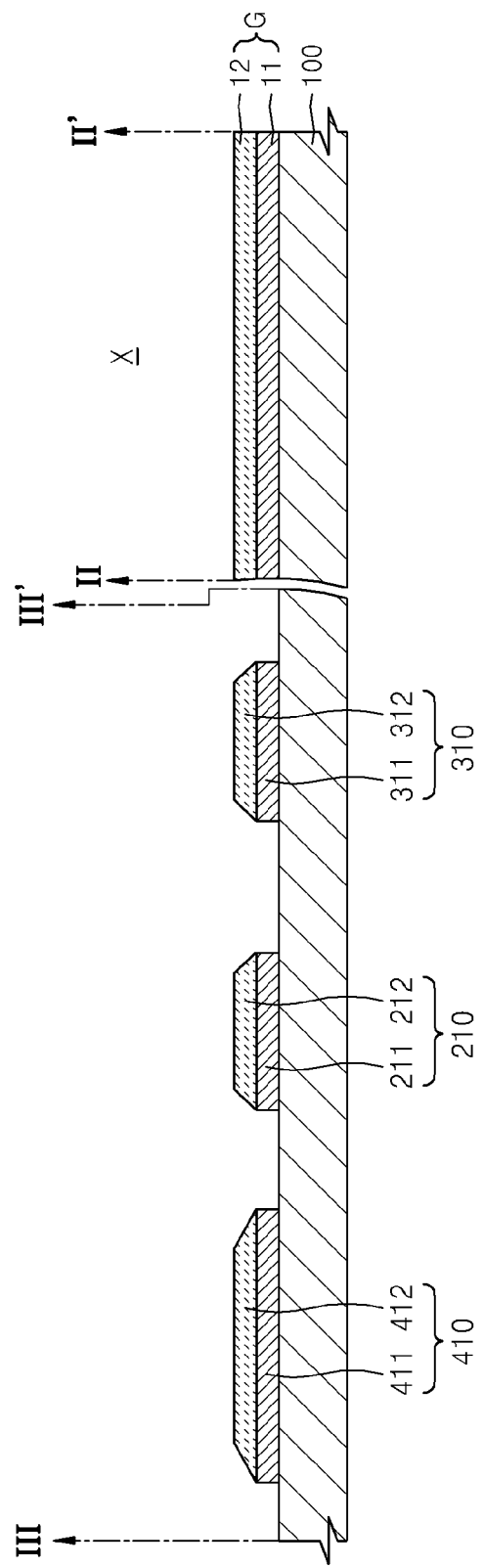
FIGS. 6, 7, 8, 9, 10, 11, and 12 are cross-sectional views showing a method of manufacturing the organic electroluminescence display of FIG. 2, according to an exemplary embodiment of the present invention.

Referring to FIG. 6, the second gate electrode 210 of the second TFT TR2, the lower electrode 310 of the capacitor Cst, and the gate line G are simultaneously formed from the same layers of material, on the substrate 100. More specifically, after forming a transparent conductive material layer on an entire surface of the substrate 100, a low resistance conductive material layer is formed on the transparent conductive layer. Afterwards, the second gate electrode 210, the lower electrode 310, the gate line G, and the pixel electrode 410 are patterned using a first mask.

Accordingly, the second gate electrode 210, the lower electrode 310, the gate line G, and the pixel electrode 410 respectively include double layers and may be formed simultaneously. Although not shown, a buffer layer (not shown) may also be formed on the substrate 100.

Figure 7:
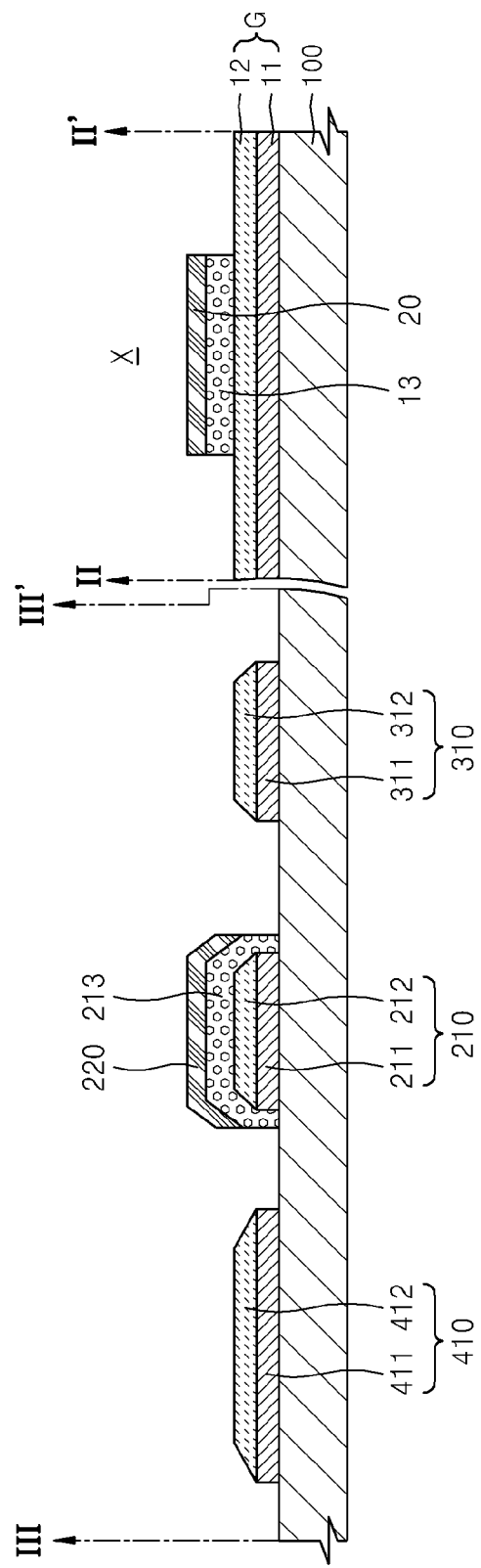

Referring to FIG. 7, the second gate insulating layer 213 is formed on the second gate electrode 210, and the insulating island 13 is formed in the crossing region X, The insulating island 13 and the second gate insulating layer 213 are formed simultaneously from the same layer of material.

More specifically, an insulating layer is formed on an entire surface of the resultant structure of FIG. 6. The insulating layer is patterned to form the second gate insulating layer 213 on the second gate electrode 210 and the insulating island 13 in the crossing region X, using a second mask.

Accordingly, the second gate insulating layer 213 and the insulating island 13 may be simultaneously formed on the same layer and using the same material. Also, the second gate insulating layer 213 and the insulating island 13 are separated from each other.

Also, referring to FIG. 7, the second active layer 220 that includes an oxide semiconductor is formed on the second gate insulating layer 213, and the semiconductor island 20 is formed on the insulating island 13 using the same layer of material. More specifically, after forming a layer that includes an oxide semiconductor on an entire surface of the substrate 100, the layer is patterned to form the second active layer 220 on the second gate insulating layer 213 and the semiconductor island 20 on the insulating island 13, using the second mask.

Accordingly, the second active layer 220 and the semiconductor island 20 may be formed using the same layer of material. Also, the semiconductor island 20 and the second active layer 220 are separated from each other and may be independently formed.

Meanwhile, for convenience of explanation, the process of forming and patterning of the insulating layer and the process of forming and patterning of the layer that includes an oxide semiconductor are separately described. However, after sequentially forming the insulating layer and the layer that includes an oxide semiconductor, the structure of FIG. 7 can be formed by a single patterning operation, using the second mask.

According to the current embodiment, in order to have a minimum parasitic capacitance in the crossing region X, the semiconductor island 20 and the insulating island 13 may be formed to have the same area. For example, a width of the semiconductor island 20 in the X-axis direction may be equal to that of the insulating island 13, and a length of the semiconductor island 20 in the Y-axis direction may be equal to that of the insulating island 13.

Figure 8:
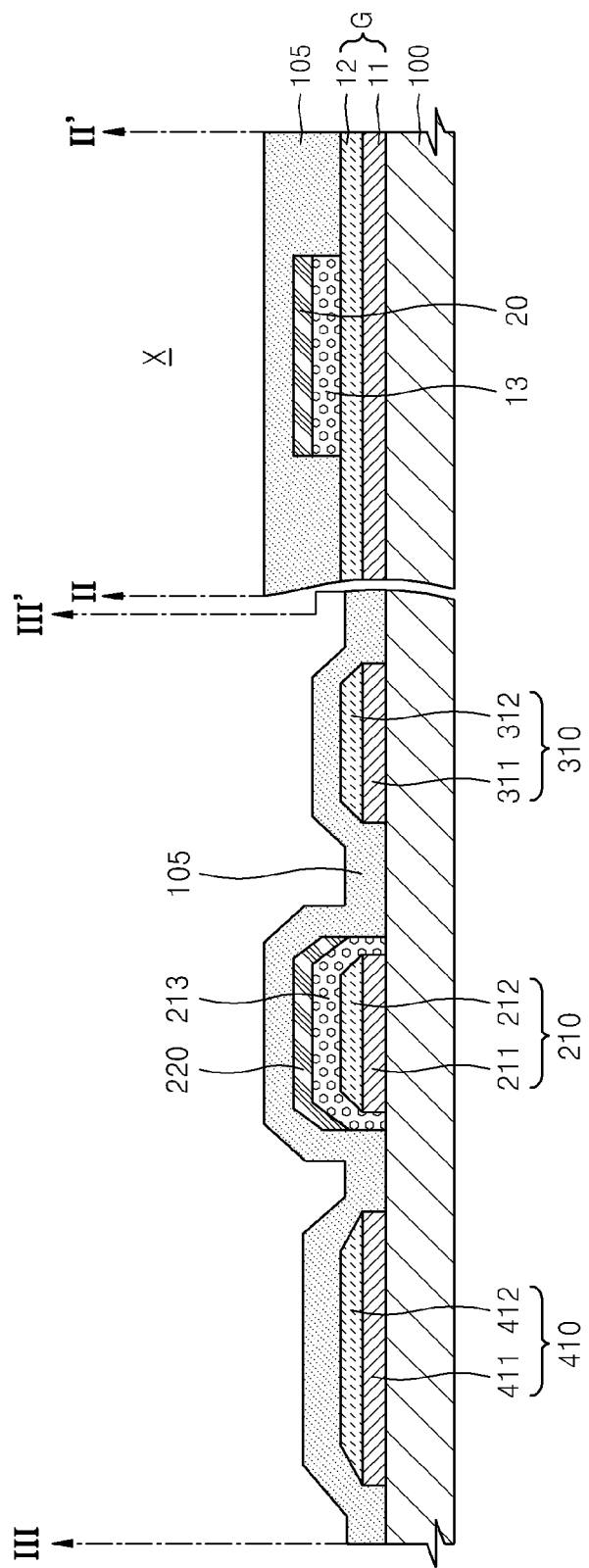

Referring to FIG. 8, the first insulating layer 105 is formed on an entire surface of the structure of FIG. 7. Accordingly, the first insulating layer 105 completely covers the second active layer 220, the lower electrode 310, and the semiconductor island 20.

Figure 9:
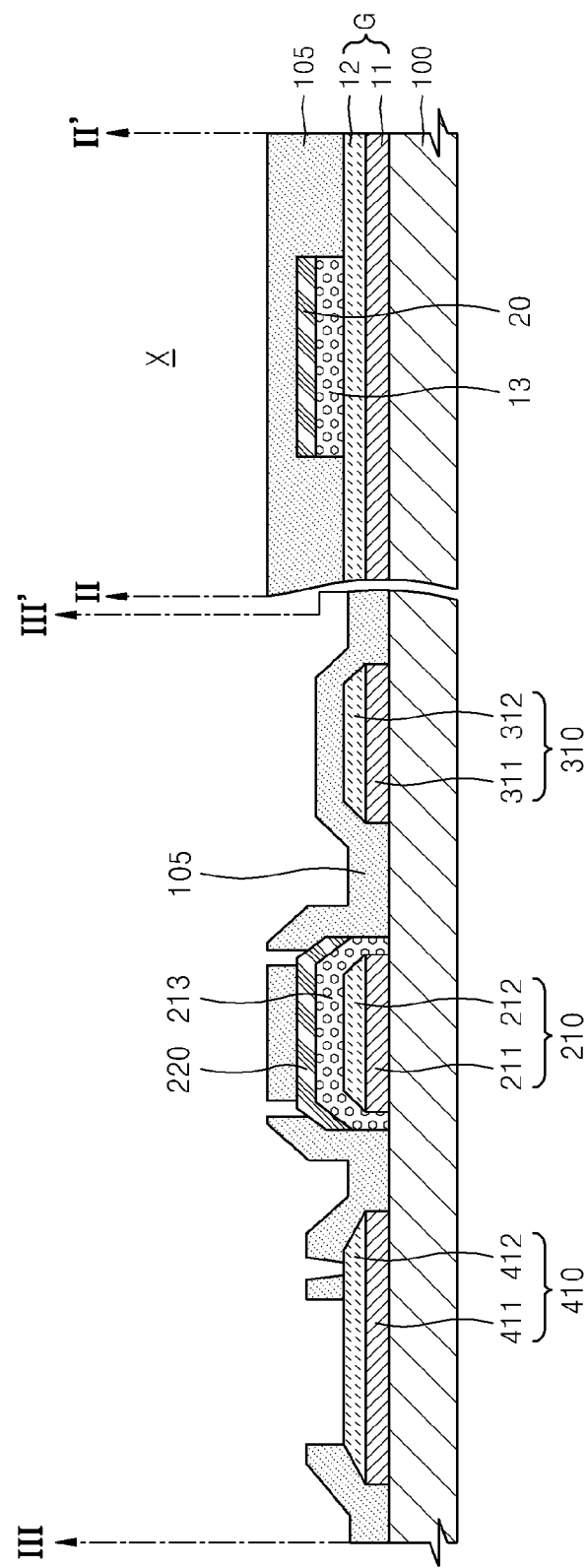

Referring to FIG. 9, a contact hole that exposes the second active layer 220 and an opening and a contact hole that expose the pixel electrode 410, are formed on the structure of FIG. 8, using a third mask. Accordingly, the pixel electrode 410 is exposed through the opening, by removing at a portion of the first insulating layer 105.

Figure 10:
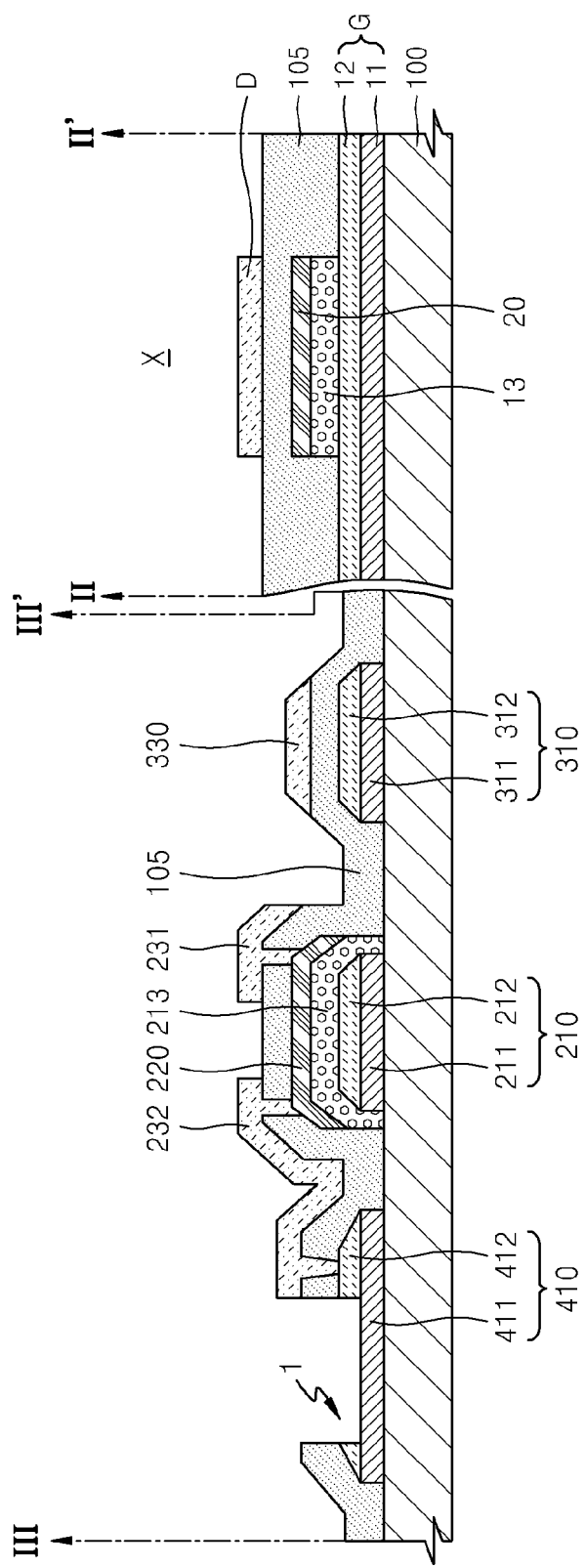

Referring to FIG. 10, the second source electrode 231 and the second drain electrode 232, the upper electrode 330, and the data line D are simultaneously formed from the same layer of material. More specifically, after forming a metal layer on an entire surface of the resultant structure of FIG. 9, the second source electrode 231, the second drain electrode 232, the upper electrode 330, and the data line D are patterned by using a fourth mask. At this point, the second source electrode 231 is connected to the second active layer 220 through the contact hole, and the second drain electrode 232 is connected to the second active layer 220 and the second electrode layer 412 of the pixel electrode 410 through the contact holes.

In the process of forming the structure of FIG. 10, a first opening 1 that exposes the first electrode layer 411 is formed by etching a portion of the second electrode layer 412 of the pixel electrode 410. As such, a portion of the first electrode layer 411 is exposed through the opening in the first insulating layer 105.

Figure 11:
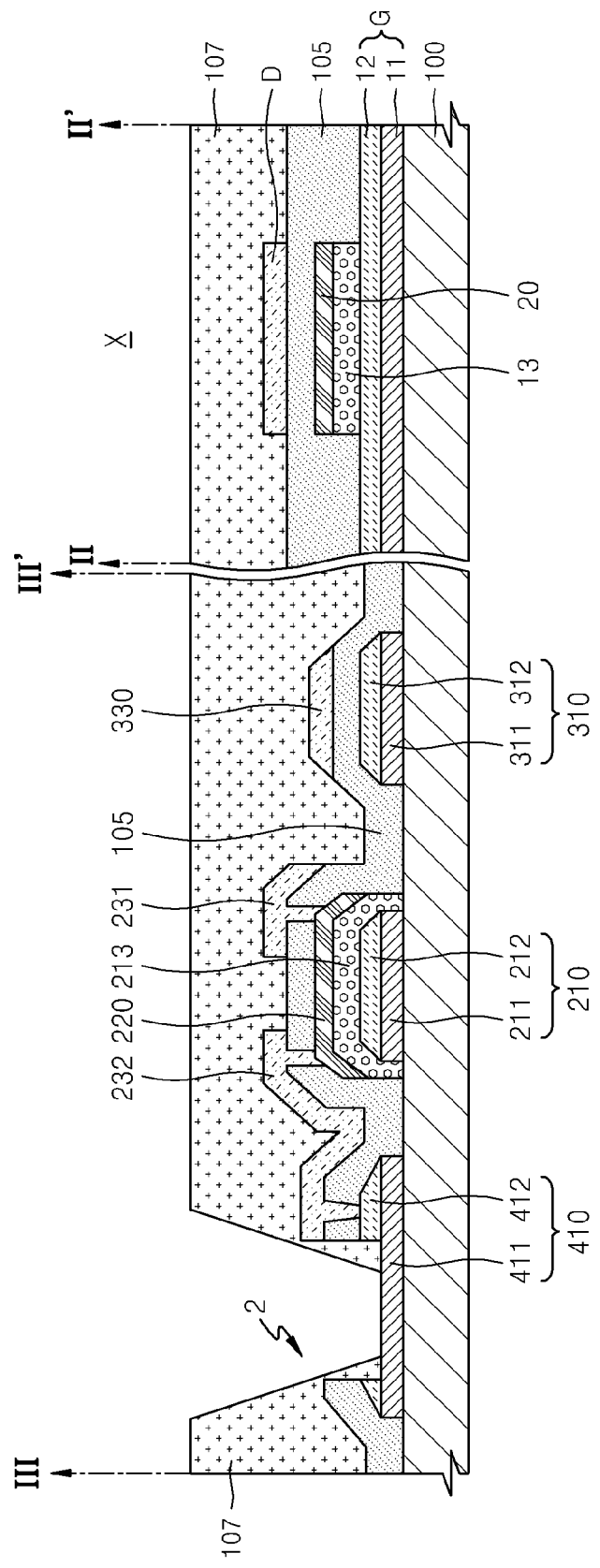

Referring to FIG. 11, the pixel-defining layer 107 is formed on an entire surface of the structure of FIG. 10. Accordingly, the pixel-defining layer 107 covers the second source electrode 231, the second drain electrode 232, the upper electrode 330, the data line D, and the pixel electrode 410. A second opening 2 is formed by removing a portion of the pixel-defining layer 107 that faces the pixel electrode 410.

The second opening 2 may be formed in the first opening 1. In this way, a short circuit problem that can occur, due to the second electrode layer 412 of the pixel electrode 410 that surrounds the first opening 1, can be prevented.

Figure 12:
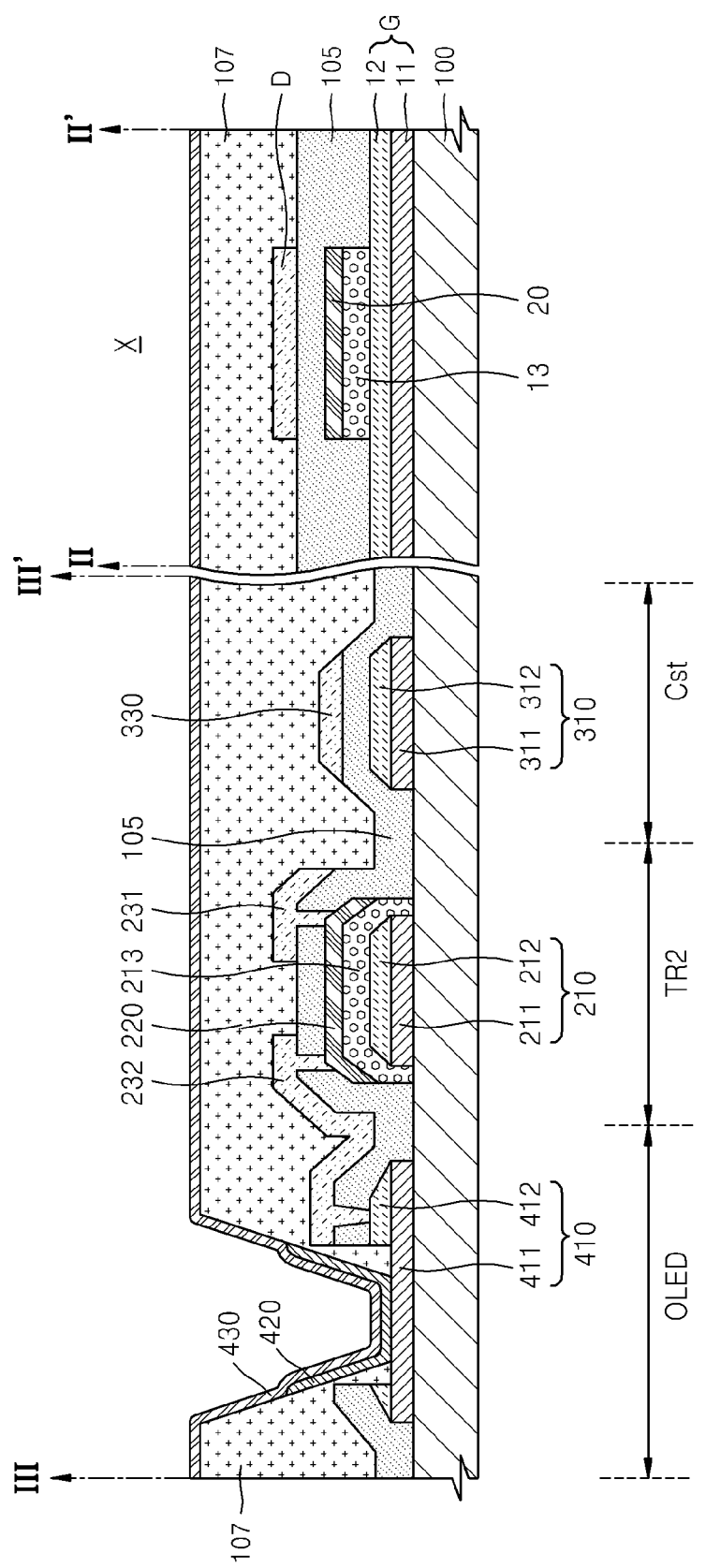

Referring to FIG. 12, the organic light-emitting layer 420 is formed to directly contact the first electrode layer 411 through the second opening 2. Also, the facing electrode 430 is formed on the organic light-emitting layer 420.

The insulating island 13 and the semiconductor island 20 can be formed in the crossing region X, when manufacturing the first and second TFTs TR1 and TR2, without using any additional process. Also, the charge capacity of the capacitor Cst can be increased by interposing only the first insulating layer 105 between the lower electrode 310 and the upper electrode 330, without using any additional process.

According to an exemplary embodiment of the present invention, an image having a high resolution can be realized by reducing the parasitic capacitance in the crossing region X and increasing the charge capacity of the capacitor Cst. Also, an economical method is provided, because the organic electroluminescence display can be manufactured by a reduced number of mask processes.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence display comprising:
   a substrate;
   a gate line disposed on the substrate and extending in a first direction;
   a data line disposed on the substrate and extending in a second direction substantially perpendicular to the first direction, the gate line and data line overlapping in a crossing region;
   a first thin-film transistor (TFT) electrically connected to the gate line and the data line, comprising a gate electrode, an active layer that comprises an oxide semiconductor, a source electrode, a drain electrode, and a gate insulating layer interposed between the gate electrode and the active layer;
   a capacitor electrically connected to the first TFT and comprising a lower electrode comprising the same material as the gate electrode, and an upper electrode;
   a insulating layer interposed between the lower electrode and the upper electrode;
   a second TFT electrically connected to the capacitor;
   an organic light-emitting diode (OLED) electrically connected to the second TFT;
   a semiconductor island disposed in the crossing region and separated from the active layer, the semiconductor island comprising the oxide semiconductor; and
   an insulating island disposed in the crossing region, between the semiconductor island and the gate line, and comprising the same typo of material as the gate insulating layer,
   wherein the insulating island and the semiconductor island have the same size and shape.

2. The organic electroluminescence display of claim 1, wherein:
   the gate electrode extends from the gate line; and
   the source electrode extends from the data line.

3. The organic electroluminescence display of claim 1, wherein the gate electrode comprises:
   a first conductive layer that comprises a transparent conductive material; and
   a second conductive layer disposed on the first conductive layer and comprising a low resistance conductive material.

4. The organic electroluminescence display of claim 1, wherein the insulating layer is disposed between the active layer and the source and drain electrodes.

5. The organic electroluminescence display of claim 1, wherein the insulating layer is also disposed between the semiconductor island and the data line, in the crossing region.

6. The organic electroluminescence display of claim 1, wherein:
   the widths of the semiconductor island and the insulating island extend in the first direction and are equal; and
   the lengths of the semiconductor island and the insulating island extend in the second direction and are equal.

7. The organic electroluminescence display of claim 1, wherein the lower electrode and the gate electrode each comprise:
   a first layer that comprises a transparent conductive material; and
   a second layer disposed on the first layer and comprising a low resistance conductive material.

8. The organic electroluminescence display of claim 1, wherein the OLED comprises:
   a pixel electrode electrically connected to the second TFT;
   a facing electrode facing the pixel electrode; and
   an organic light-emitting layer interposed between the pixel electrode and the facing electrode.

9. The organic electroluminescence display of claim 8, wherein the pixel electrode comprises:
   a first electrode layer directly connected to the organic light-emitting layer and comprising a transparent conductive material; and
   a second electrode layer directly connected to the second TFT and comprising a low resistance conductive material.

10. A method of manufacturing an organic electroluminescence display, the method comprising:
    patterning a first layer to form a gate electrode of a thin-film transistor (TFT), a lower electrode of a capacitor, and a gate line on a substrate;
    patterning a second layer to form a gate insulating layer on the gate electrode and an insulating island on the gate line, the insulating island being spaced apart from the gate insulating layer;
    patterning a third layer comprising an oxide semiconductor, to form an active layer on the gate insulating layer, and a semiconductor island on the insulating island, the semiconductor island being spaced apart from the active layer;
    forming an insulating layer on the active layer, the lower electrode, and the semiconductor island; and patterning a fourth layer to form a source electrode, a drain electrode, an upper electrode, and a data line on the insulating layer, the source and drain electrodes contacting the active layer, the upper electrode facing the lower electrode, and the data line extending across the gate line with the semiconductor island being disposed therebetween, wherein the insulating island and the semiconductor island have the same size and shape.

11. The method of claim 10, wherein: the widths of the semiconductor island and the insulating island extend in a first direction and are equal; and The lengths of the semiconductor island and the insulating island extend in a second direction and are equal.

12. The method of claim 10, further comprising forming an organic light-emitting device (OLED) on the substrate, wherein, the patterning of the first layer further comprises forming a pixel electrode of the OLED, and the forming of the insulating layer further comprises forming the insulating layer on the pixel electrode.

13. The method of claim 12, wherein:

the first layer comprises a transparent conductive layer disposed on the substrate and a low resistance conductive layer disposed on the transparent conductive layer; and the patterning of the first layer comprises patterning the transparent conductive layer and the low resistance conductive layer to form the thin-film transistor (TFT), lower electrode, and the gate line.

14. The method of claim 13, further comprising forming a first opening in the insulating layer and the low resistance conductive layer of the pixel electrode, thereby exposing the transparent conductive layer of the pixel electrode.

15. The method of claim 14, further comprising forming a pixel-defining layer on the source electrode, the drain electrode, the upper electrode, the data line, and the pixel electrode.

16. The method of claim 15, further comprising forming a second opening in the pixel-defining layer, thereby exposing a portion of the transparent conductive layer of the pixel electrode.

17. The method of claim 16, further comprising forming an organic light-emitting layer directly on the exposed portion of the transparent conductive layer of the pixel electrode.

18. The method of claim 17, further comprising forming a facing electrode on the organic light-emitting layer.

* * * * *